United States Patent [19]
Gelin et al.

[11] Patent Number: 5,180,314
[45] Date of Patent: Jan. 19, 1993

[54] CONNECTOR FOR SHIELDED PAIR CABLE WITH GROUNDING DRAIN CONDUCTOR

[75] Inventors: Claude Gelin, Creteil; Christian Bordino, Bruyeres Le Chatel, both of France

[73] Assignee: Cegelec, Levallois Perret, France

[21] Appl. No.: 756,097

[22] Filed: Sep. 6, 1991

[30] Foreign Application Priority Data

Sep. 7, 1990 [FR] France .................. 90 11116

[51] Int. Cl.⁵ .................................................. H01R 4/24
[52] U.S. Cl. ........................................ 439/394; 439/579
[58] Field of Search .......................... 439/578–585, 439/389–394, 620, 901–906

[56] References Cited

U.S. PATENT DOCUMENTS

| | | |
|---|---|---|
| 4,533,197 | 8/1985 | Prince et al. |
| 4,559,421 | 12/1985 | Lapke et al. ............... 439/579 |
| 4,626,058 | 12/1986 | Prince et al. ............... 439/394 |
| 4,744,774 | 5/1988 | Poeuza ......................... 439/394 |
| 5,044,978 | 9/1991 | Gelin ........................... 439/579 |

FOREIGN PATENT DOCUMENTS 0400521 5/1990 European Pat. Off. .
3418582 12/1984 Fed. Rep. of Germany .

*Primary Examiner*—David L. Pirlot
*Attorney, Agent, or Firm*—Sughrue, Mion, Zinn, Macpeak & Seas

[57] ABSTRACT

A connector for a shielded pair type cable with grounding drain conductor is designed to enable equipment to be connected in series by means of a shielded drop and insert cable to a shielded cable which comprises a pair of wires and an electromagnetic shield continuity drain conductor. The connector comprises a terminal block comprising a support member in which is accommodated a cutting device disposed between four connecting members each adapted to receive one wire of the drop and insert cable and one of the two wires of the cable. The terminal block is housed in an insulative material casing inside a Faraday cage connected to two grounding terminals accessible from outside the casing, one directly and the other via a capacitor.

6 Claims, 4 Drawing Sheets

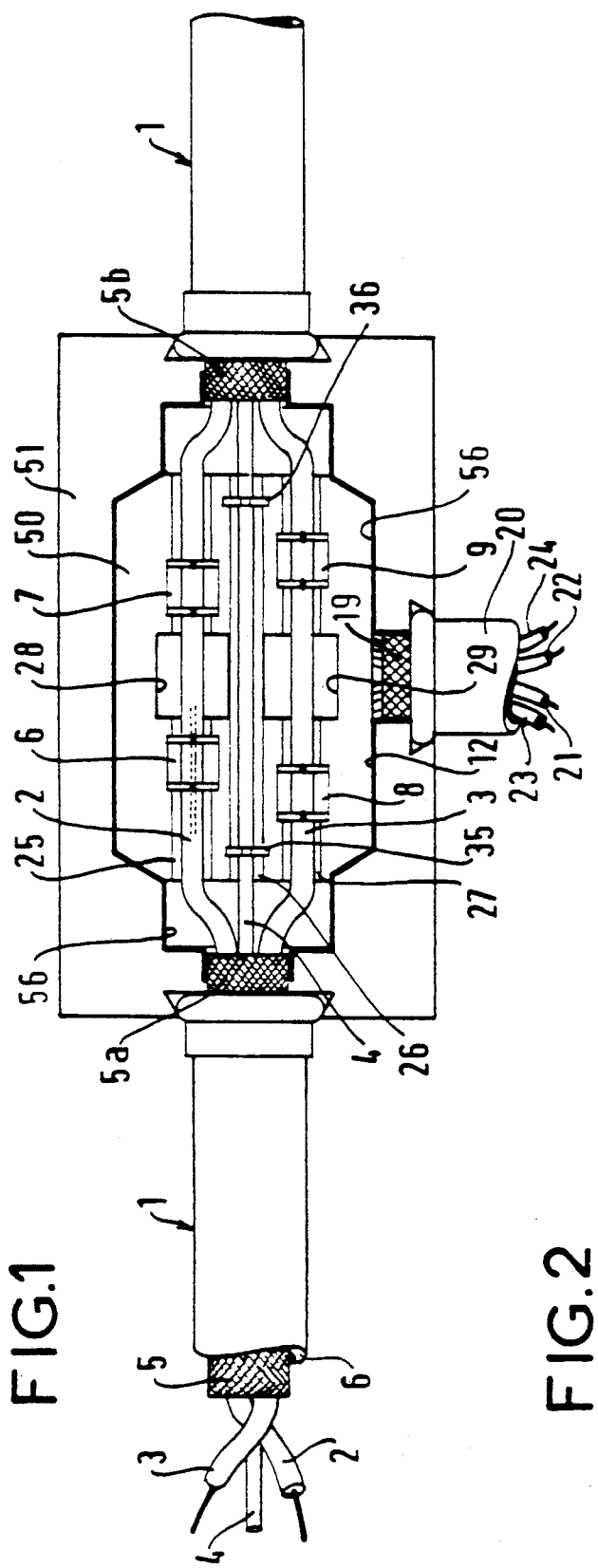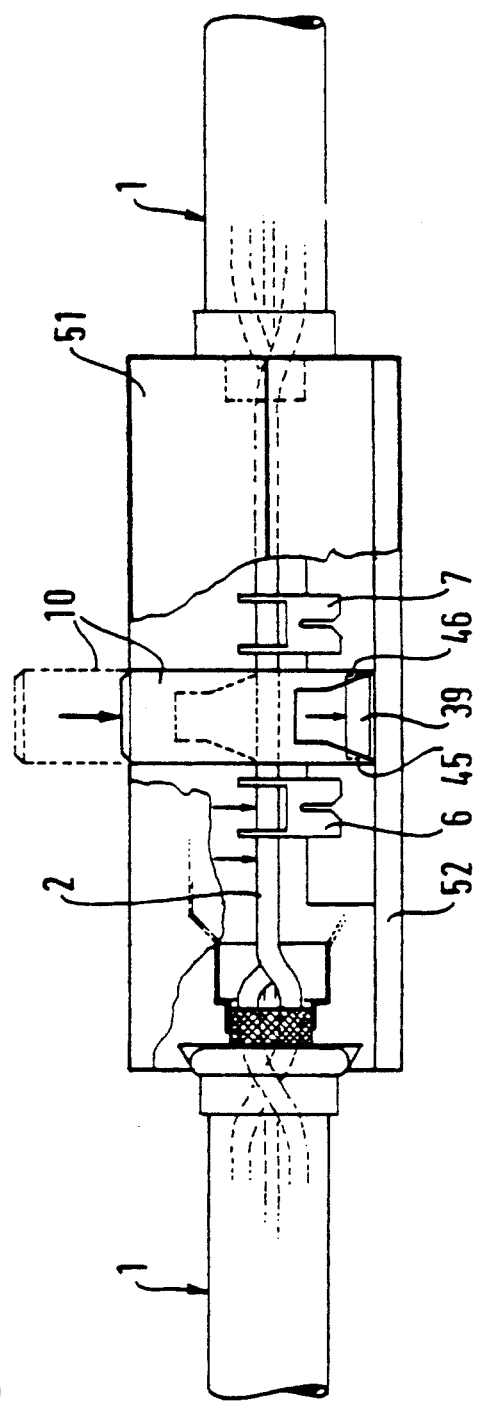

CONNECTOR FOR SHIELDED PAIR CABLE WITH GROUNDING DRAIN CONDUCTOR

BACKGROUND OF THE INVENTION

1. Field of the Invention

The invention concerns a connector for connecting a data transmitter and/or receiver to a shielded pair type transmission cable with grounding drain conductor.

2. Description of the Prior Art

The advantages of shielded pair connections are well known and have been exploited for many years in telecommunications. Installed by relatively simple and low cost proven techniques, these links are used to transmit analog and digital signals, in particular over point-to-point links, under good conditions and with good performance.

For this reason they are recommended for local area networks in which they interconnect equipment provided for this purpose with data transmitter and/or receiver equipments connected in exactly the same way to one or more shared links.

Each equipment along a link is connected to an assigned point on the cable constituting the link by means of a connector. In a conventional system the equipments are connected in series.

For reasons including electrical continuity of the conductor wires used to transmit the data and the shielding protecting them against electromagnetic interference, it is necessary to minimize the damage caused to a cable by connecting to it the connectors used to connect the data transmitter/receiver equipments of the data equipment concerned.

This has lead to the design of cables in which all the data transmission wires are surrounded with an electromagnetic shield with which is associated a longitudinal shield continuity drain conductor, galvanically connected to the shield but separable therefrom when the shield must be removed locally to allow connector access to the transmission wires, the drain conductor being adapted to remain intact at the connector and so to ensure electrical continuity of the shield along the cable, despite such local removal.

This has also lead to the development of connectors provided with special terminal blocks such as that described in French patent application No 2647970, to be described briefly hereinafter, enabling the connection of a transmitter and/or receiver equipment by means of a shielded drop and insert cable comprising two pairs of transmission wires to a shielded cable as described above which comprises one pair of transmission wires and a shield continuity drain conductor and which is adapted to have a plurality of transmitter/receiver equipments connected to it in series.

One objective of the present invention is to improve the transmission performance of links fitted with this type of connector by modifying the connectors themselves and in particular by enabling verification of the operational status of the links and consequently of the system comprising them.

SUMMARY OF THE INVENTION

The invention consists in a connector for connecting a transmitter and/or receiver using a shielded drop and insert cable comprising two pairs of individually insulated transmission wires to a shielded cable which comprises one pair of individually insulated transmission wires and an electromagnetic shield continuity drain conductor within an electromagnetic shield, said connector comprising to this end a terminal block comprising a support member in which is accommodated a cutting device disposed between four clamp and insulation cutting type connecting members each enabling an individual connection of two insulated wires and each designed to receive one of the four transmission wires of the drop and insert cable and one of the two transmission wires of the cable, the cutting device being movable inside a housing of the support member between a first position enabling two wires to be passed between each of the two connecting members, situated to either side of a compartment of the housing and different for the two crossing wires, and a second position in which the cutting device is disposed between the connecting members situated to either side of the compartments of the housing, optionally after first cutting the crossing wires, which connector, accommodated in a insulative material housing, comprises an internal Faraday cage into which the cable conductors extend, in which are accommodated the support member and the connecting members and to which the shields of said cables are connected in such a way as to form with said cable shields a container proof against electromagnetic radiation and in that said cage is connected to two grounding terminals accessible from outside the housing, one directly and the other via a capacitor.

The invention, its features and its advantages are explained in the following description given with reference to the accompanying drawings.

BRIEF DESCRIPTION OF THE DRAWINGS

FIGS. 1 and 2 are respectively a schematic top view and a schematic side view of the prior art terminal block as defined in the earlier patent application mentioned above.

DETAILED DESCRIPTION OF THE INVENTION

Figure 3:
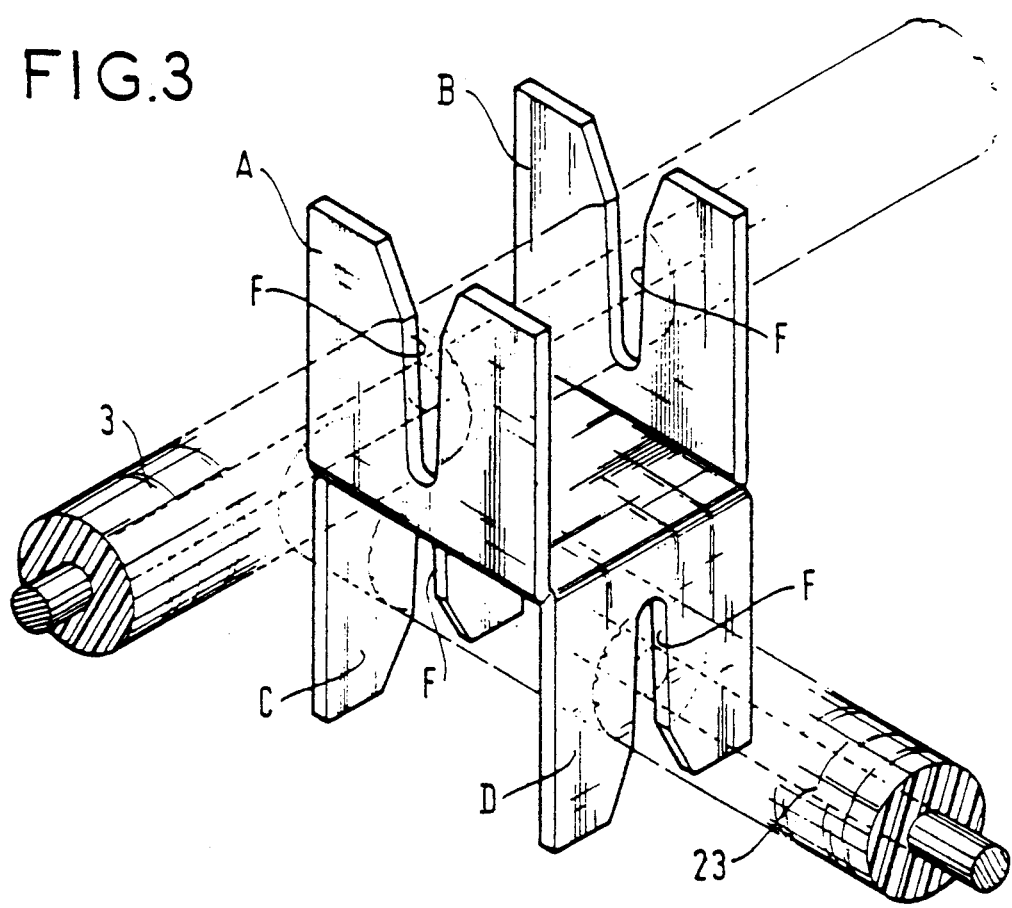
FIGS. 3 and 4 respectively show a connecting member and a cutting device of the known terminal block of FIGS. 1 and 2.

The prior art terminal block shown in FIG. 1 is designed to connect equipment (not shown) to an electromagnetically shielded cable 1 which comprises a pair of transmission conductor wires 2 and 3, a shield continuity drain conductor 4, a metal shield 5 forming an electromagnetic screen for the transmission wires and an insulative sheath 6 covering the metal shield 5. The electrically conductive drain conductor 4 is in contact with the shield 5 over the entire length of the cable comprising them.

Fitting a connector to a cable 1, which passes through the connector, entails partial removal of the insulative sheath 6 and of the metal shield 5 from the cable at the intended location of the connector to provide access to the wires 2 and 3 and to the drain conductor 4 for connecting members which are, for example, attached to a support member provided in the connector.

The wire 2 is connected to connecting members 6 and 7 disposed on either side of a compartment 28 interrupting a channel 25 designed to have this wire passed through it between the two members 6 and 7, within a support member 50, and the other wire 3 is connected to two connecting members 8 and 9 disposed on either side of a compartment 29 interrupting a channel 27 parallel to the channel 25 and designed to have this other wire pass through it between the members 8 and 9.

The drain conductor 4 is passed through a channel 26 in the support member 50 between and parallel to the channels 25 and 27. Two members 35, 36 in this channel immobilize the drain conductor 4 accommodated in it in a similar way to that in which the wires 2 and 3 are immobilized in the connecting members; they also allow the drain conductor to be connected to the electromagnetic shield of the connector.

The connecting members 6 through 9 are of the forked type and an electrically insulated wire is connected by forcing it into the slit of one such fork so that the insulation covering the wire is cut through as the wire is inserted.

Each connecting member 6 through 9 is made from a material that is a good conductor and comprises two orthogonal pairs of parallel forks A through D, the parallel slots F of the two forks A, B of one pair tapering in a direction opposite to that of the parallel slots F of the forks C, D of the other pair, as can be seen in FIG. 3, so as to allow two independent wires, for example the wires 3 and 23, to be connected by a single member.

In a first embodiment (FIG. 1), the equipment to be connected is connected to the terminal block by an electromagnetically shielded drop and insert cable 20 designed to enable serial connection of the equipment via a drop and insert point. The drop and insert cable 20 conventionally comprises a metal shield 19 enclosing four individually insulated transmission wires 21, 22, 23, 24.

The connecting members 6 through 9 each receive one conductor 2 or 3 in the parallel slots F of a pair of forks, for example the forks A, B. and one of the four conductors 21 through 24 in the slots F of the other pair of forks C, D.

The serial connection of the equipment to the cable 1 by way of the drop and insert cable 20 is effected by cutting the wires 2 and 3 accommodated in the channels 25, 27 between the connecting members which hold them, in the area in which these wires pass through one of the compartments 28, 29 situated on their path.

The wires 2 and 3 are cut by a device 10 movable between two positions in the support member 50. In a first or pre-connection position, which is a projecting position in this example, of the cutting device 10 shown in dashed outline in FIG. 2, it is possible to pass the wire 2 between the connecting terminals 6, 7 through the compartment 28 and the wire 3 between the connecting terminals 8, 9 through the compartment 29.

Figure 4:
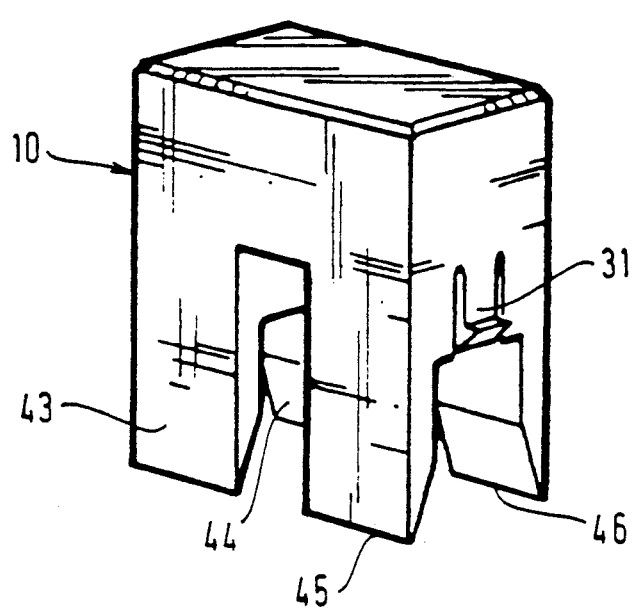

Because of the knife-life configuration of the parts concerned of the cutting device 10 (see FIGS. 2 and 4), the movement (depression in this example) of the cutting device 10 to a second position cuts the wires 2 and 3.

To this end the cutting device 10, which is molded from an insulative material, comprises a common part projecting from the support member 50 in the pre-connection position and which is pushed down to depress the cutting device 10. This common part is extended by two cutting units each provided with two knife blades 43 and 44 designed to enter the compartment 28 and two knife blades 45 and 46 designed to enter the compartment 29. The two blades of each cutting unit slide against the facing walls of the compartment perpendicular to the channel interrupting the compartment.

Depression of the cutting device 10 previously positioned above the wires running through the channels 25, 27 causes a section of these wires to be cut by the two blades which bear on them at the common edges of the channels and the walls of the compartments perpendicular to them.

The cutting device 10 is locked into the compartments 28, 29 in the depressed position after cutting the wires by barbs 31 (FIG. 4) at the ends of elastic lugs that it comprises which snap into corresponding recesses (not shown) in the inside walls of the compartments.

The two sections of wire cut by the knives of the cutting device 10 are each held in a depressed position in a void of the compartment under the cutting device to prevent any possibility of short-circuiting as the result of unwanted displacement of these sections within the connector.

The equipment (not shown) which is connected by one of the wires 21 through 24 to each of the two sections of the wires 2 and 3 cut by the displacement of the cutting device 10 is simultaneously connected in series with the transmission link constituted by the wires 2, 3.

Whether the cutting device 10 is projecting from the connector or not, as shown in dashed outline in FIG. 2, provides the user with a visual indication of whether the drop and insert connection had been made or remains to be made.

Figure 5:
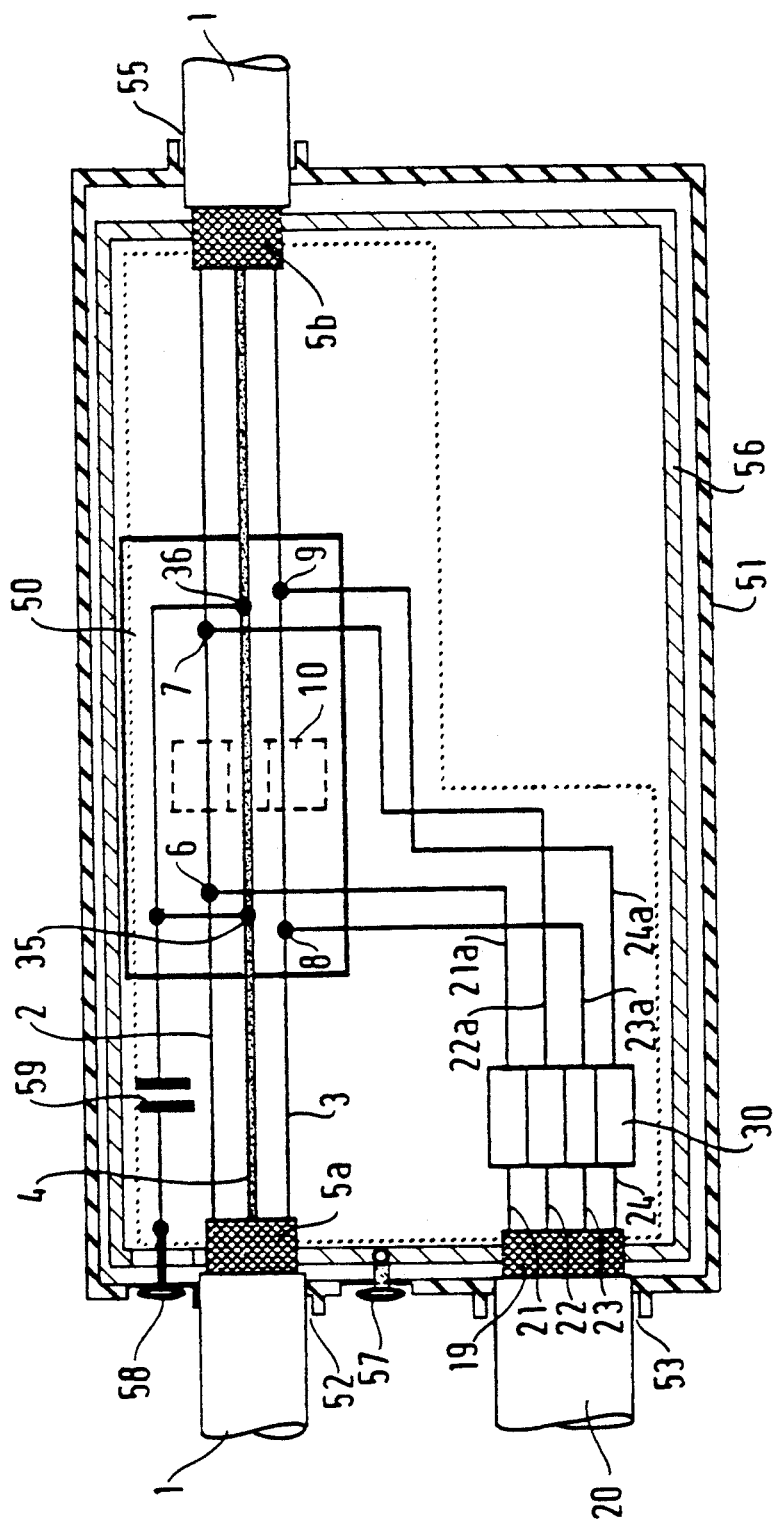
FIGS. 5 and 6 are schematic representations of two variants of the connector in accordance with the present invention.

In the embodiment shown in FIG. 5, the support member 50 provided with the pats 6 through 9 and 35, 36 is disposed, possibly removably, within a housing 51 comprising, for example, two back-to-back shell members incorporating ports through which the cables 1 and 20 are passed. There are three ports 52, 53 and 55 which are provided with conventional means (not shown) such as cable glands to immobilize the cables relative to the housing 51 and to provide a good seal.

The cable 1 is passed through the housing 51 of the connector by passing the cable through two ports 52 and 55 facing each other on two opposed lateral surfaces of the housing, the port 53 disposed laterally relative to the port 52 on the same surface being provided for the drop and insert cable 20.

The conductors 21 through 24 of the drop and insert cable 20 terminate at a terminal block 30 by which they are individually connected to the connecting members 6 through 9, via links 21a through 23a preferably preestablished when the connector is assembled in the manufacturing plant.

To prevent the signals carried by the cables 1 and 20 being disturbed by interference, the housing 51 of the connector is itself electromagnetically shielded where the metal shields 5 and 19 of the cables are interrupted and provides continuity of shielding with the metal shields of the cables. If the housing is molded from an insulative material, it incorporates an internal Faraday cage 56 to which are connected the shield 19 of the drop and insert cable and the two separated ends 5a, 5b of the shield 5 of the cable 1. The cable conductors enter the cage through appropriate ports in a manner familiar to the man skilled in the art.

The Faraday cage 56 comprises aluminum members located against the inner wall of the housing 51 to form a container proof against electromagnetic interference into which the conductors of the cables 1 and 20 extend and in which are enclosed the support member, the parts that it carries and auxiliary connecting members to be described in more detail later.

The Faraday cage 56 may also be obtained by applying a thick metal coating to the inside wall of the housing 51.

Whichever solution is adopted, the Faraday cage 56 is provided with a first connecting terminal 57 accessible from outside the housing 51 for connecting the Faraday cage direct to ground and so grounding the ends 5a, 5b of the metal shield 5, the drain conductor 4 and the metal shield 19 when the cables 1 and 20 are fitted.

A second connecting terminal 58 accessible from outside the housing 51 is connected to the Faraday cage 56 through a capacitor 59. It connects the Faraday cage, the ends 5a, 5b of the metal shield 5, the drain conductor 4 and the metal shield 19 to ground to eliminate interference signals which are not in the form of DC voltages, in particular high-frequency interference signals.

The capacitor 59 has a capacitance of 4.7 nF. It is enclosed in the Faraday cage 56 to protect it and it is directly connected to the conductive members 35, 36 which position the drain conductor 4 on the support member 50 and to the terminal 58.

When a plurality of equipments are connected in series to the same cable 1, each of the equipment connectors is grounded by its terminal 58 except for the center connector of which only the terminal 57 is grounded, this avoiding the need to insulate the connectors from the cable 1.

Figure 6:
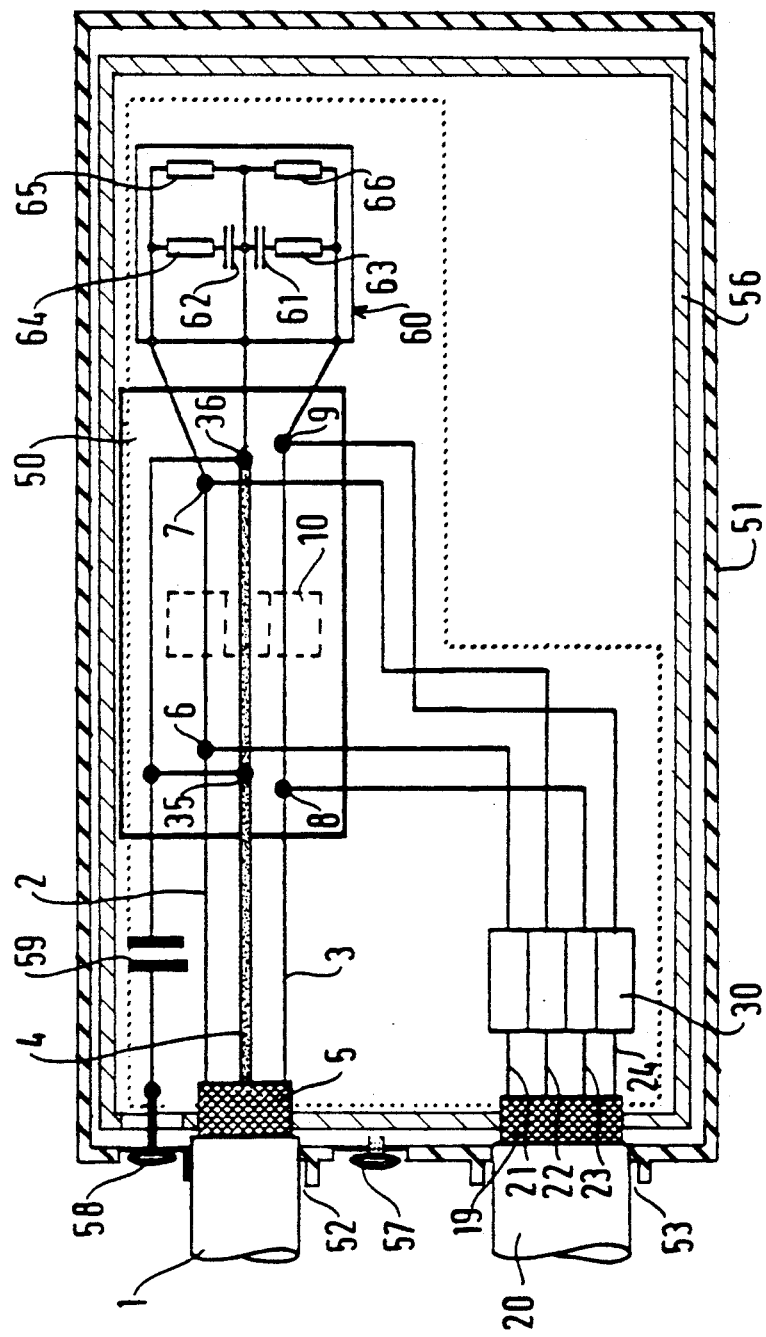

In the FIG. 6 embodiment, the Faraday cage 56 is additionally configured to contain a line terminator circuit 60 to be fitted to each of the two ends of the cable 1 to prevent mismatching causing degradation of the signals transmitted between the equipments over the transmission link provided by the cable 1.

To this end the terminator circuit 60 conventionally terminates the link across its characteristic impedance at the end where it is connected; conventionally implemented as a small molded module incorporating a printed circuit, it has a center point adapted to be connected to the drain conductor 4 of the cable 1, two series RC circuits each comprising a respective capacitor 61, 62 and a respective resistor 63, 64 and which are connected between the drain conductor and each of the transmission wires 2 and 3, respectively, via the connecting members 36, 7 and 9, and two resistors 65 and 66 each shunting one of the RC circuits.

As the cable 1 terminates in the connectors at its two ends, only one of the ports 52, 55 is used and it is preferable to have the other port closed and to dispose the terminator circuit 60 in the area of the Faraday cage 56 of the connector which is designed to have the cable pass through it and which is situated near the closed port.

If it is desirable to be able to verify the operational condition of the cable link and if the connectors are disposed at a critical point of the link, there is provision for fitting to the connector a break-in jack connected to wires 21 through 24 of the drop and insert cable and accessible from outside the Faraday cage 56 and outside the housing 51 to enable the plug-in connection of a complementary external removable plug connected to auxiliary equipment.

There is claimed:

1. Connector for connecting a transmitter and/or receiver using a shielded drop and insert cable comprising two pairs of individually insulated transmission wires to a shielded cable which comprises one pair of individually insulated transmission wires and an electromagnetic shield continuity drain conductor within an electromagnetic shield, said connector comprising a terminal block comprising a support member accommodating a cutting device disposed between four clamp and insulation cutting type connecting members each enabling an individual connection of two insulated wires and each designed to receive one of the four transmission wires of the drop and insert cable and one of the two transmission wires of the cable, the cutting device being movable inside a housing of the support member between a first position allowing two wires to pass between each of the two connecting members, situated to either side of a compartment of the housing, and a second position in which the cutting device is disposed between the connecting members situated to either side of the compartments of the housing, optionally after first cutting the crossing wires, said connector, being accommodated in an insulative material housing and comprising an internal Faraday cage into which the cable conductors extend and accommodating the support member and the connecting members and said shields of said cables being connected so as to form with said cable shields a container protecting against electromagnetic radiation and wherein said cage is connected to two grounding terminals accessible from outside the housing, one directly to said cage and the other via a capacitor.

2. Connector according to claim 1 wherein the housing comprises a break-in jack connected to the wires of the drop and insert cable and accessible from outside the Faraday cage and outside the housing to enable a connection by plugging in an external complementary removable plug connected to auxiliary equipment.

3. Connector according to claim 1 wherein the capacitor connecting one of the grounding terminals to the internal Faraday cage is inside said cage.

4. Connector according to claim 3 wherein the capacitor is connected to the internal Faraday cage by at least one of the conductive members immobilizing on the support member the drain conductor of the cable on which the connector is mounted.

5. Connector according to claim 1 wherein the internal Faraday cage contains a line terminator circuit adapted to close the transmission line constituted by the cable across its characteristic impedance when the connector is fitted to one end of said cable.

6. Connector according to claim 5 wherein the terminator circuit is housed on the other side of the support member relative to a port through which the cable enters the housing, being connected to the connecting members provided for the wires and the drain conductor of said cable which are situated on the other side of the support member relative to said port.

* * * * *